United States Patent
Matoy

(10) Patent No.: US 9,585,263 B2
(45) Date of Patent: Feb. 28, 2017

(54) PIN TO PCB CONNECTION STRUCTURE AND METHOD

(71) Applicant: Continental Automotive Systems, Inc., Auburn Hills, MI (US)

(72) Inventor: Jennifer L. Matoy, Leonard, MI (US)

(73) Assignee: Continental Automotive Systems, Inc., Auburn Hills, MI (US)

(*) Notice: Subject to any disclaimer, the term of this patent is extended or adjusted under 35 U.S.C. 154(b) by 54 days.

(21) Appl. No.: 14/515,152

(22) Filed: Oct. 15, 2014

(65) Prior Publication Data
US 2016/0113128 A1 Apr. 21, 2016

(51) Int. Cl.
H05K 5/00 (2006.01)
H05K 3/32 (2006.01)
H01R 12/55 (2011.01)
H05K 3/40 (2006.01)
H01R 12/58 (2011.01)

(52) U.S. Cl.
CPC ........... H05K 5/0069 (2013.01); H01R 12/55 (2013.01); H05K 3/325 (2013.01); H01R 12/58 (2013.01); H05K 3/403 (2013.01); H05K 2201/09181 (2013.01); H05K 2201/1034 (2013.01); H05K 2201/1059 (2013.01); H05K 2201/10446 (2013.01)

(58) Field of Classification Search
CPC .............................. H05K 3/3405; H05K 5/069
USPC .................. 174/541; 439/62, 73, 79, 82, 84
See application file for complete search history.

(56) References Cited

U.S. PATENT DOCUMENTS

| | | | |
|---|---|---|---|
| 5,438,160 A * | 8/1995 | Batty | H01R 12/724 174/360 |
| 5,963,045 A * | 10/1999 | Zink | G01R 1/07342 324/750.16 |
| 6,801,436 B2 * | 10/2004 | Pearson | H05K 1/142 361/732 |
| 7,379,021 B2 * | 5/2008 | Lee | H01Q 1/243 343/700 MS |
| 7,413,445 B2 * | 8/2008 | Inagaki | B60R 16/0239 439/76.1 |
| 8,770,988 B2 * | 7/2014 | Furukawa | H01R 13/6658 439/606 |
| 2002/0029904 A1 | 3/2002 | Matuschik | |
| 2005/0181645 A1* | 8/2005 | Ni | H05K 5/0278 439/79 |

(Continued)

FOREIGN PATENT DOCUMENTS

| | | |
|---|---|---|
| EP | 0941020 A2 | 9/1999 |
| EP | 1965420 A2 | 9/2008 |

(Continued)

OTHER PUBLICATIONS

International Search Report and Written Opinion dated Feb. 19, 2016 from corresponding International Patent Application No. PCT/US2015/055528.

(Continued)

*Primary Examiner* — Hung V Ngo

(57) ABSTRACT

A printed circuit board assembly includes a printed circuit board (PCB) having an end. The end includes surfaces defining a plurality of electrically conductive notches therein. A plurality of electrically conductive pins is provided with each pin being received in an associated notch in a press-fitted manner so as to make electrical connection with the PCB.

5 Claims, 3 Drawing Sheets

(56) References Cited

U.S. PATENT DOCUMENTS

2006/0234530 A1* 10/2006 Chung .................. H05K 3/341
439/79
2010/0255692 A1 10/2010 Bott et al.

FOREIGN PATENT DOCUMENTS

| JP | 2009070988 A | 4/2009 |
|---|---|---|
| WO | 2009/056313 A1 | 5/2009 |
| WO | 2012/096413 A1 | 7/2012 |

OTHER PUBLICATIONS

English Translation of Abstract of JP2009070988—Patent Abstracts of Japan.

* cited by examiner

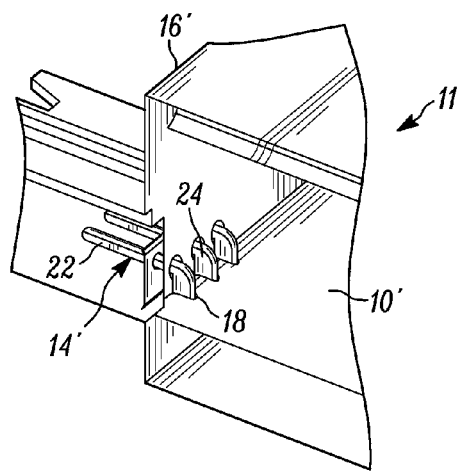 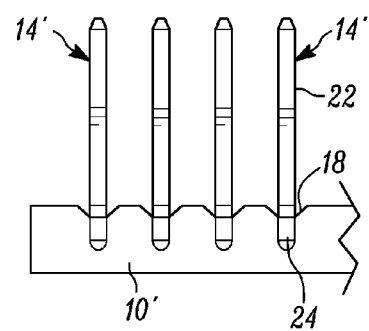
FIG. 3  FIG. 4
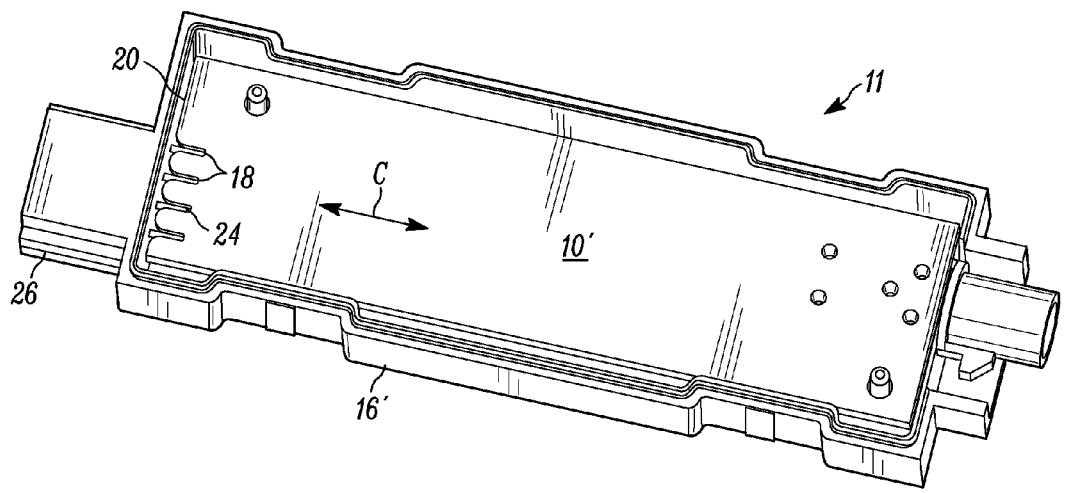
FIG. 5

PIN TO PCB CONNECTION STRUCTURE AND METHOD

FIELD

The invention relates to a printed circuit boards (PCB) and connector pins and, more particularly, to the ability to directly connect the pins to the PCB without the use of a pin header.

BACKGROUND

With reference to FIG. 1, a typical PCB 10 includes a plastic pin header 12 with pins 14 bent at a 90° angle. The pin header 12 is wave soldered to the PCB 10 to make a 90° connection. The PCB 10 is received in a housing 16, typically made of plastic. It was contemplated to use a reflow soldering process to solder the pins 14 to the PCB 10. However, since a reflow soldering process involves the parts going through an oven, the plastic pin header 12 would melt unless specifically designed for this process.

Thus, there is a need to connect pins directly to a PCB without the use of a pin header.

SUMMARY

An objective of the invention is to fulfill the need referred to above. In accordance with the principles of an embodiment, this objective is obtained by providing a printed circuit board assembly that includes a printed circuit board (PCB) having an end. The end includes surfaces defining a plurality of electrically conductive notches therein. A plurality of electrically conductive pins is provided with each pin being received in an associated notch in a press-fitted manner so as to make electrical connection with the PCB.

In accordance with another aspect of an embodiment, a method connects pins to a printed circuit board. The method provides a plurality of electrically conductive notches in an end of a printed circuit board (PCB). A plurality of electrically conductive pins is provided so that each pin aligns with an associated notch. The PCB or the plurality of pins is moved so that each pin engages the associated notch in a press-fitted manner so as to make electrical connection with the PCB.

Other objectives, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which:

FIG. 3 is a view showing the pins of FIG. 2 engaged with notches in the PCB.

FIG. 4 is a top view of the pins of the embodiment engaged in the notches of the PCB.

FIG. 5 is a view of the PCB assembly of an embodiment shown in an assembled condition.

DETAILED DESCRIPTION OF EXEMPLARY EMBODIMENTS

Figure 2:
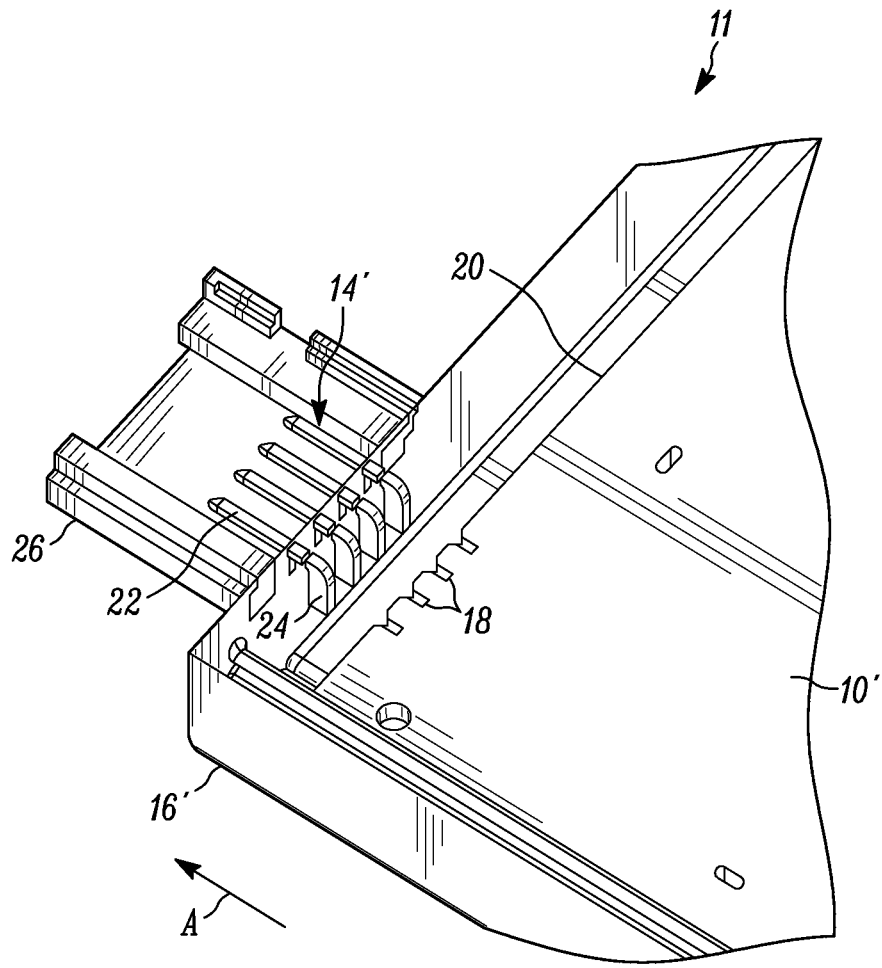
FIG. 2 is a partial view of a PCB assembly showing a PCB being inserted into a housing to engage pins in accordance with an embodiment.

With reference to FIG. 2, a printed circuit board (PCB) assembly is shown, generally indicated at 11, in accordance with an embodiment. The assembly 11 includes a PCB 10' that has surfaces defining a plurality of slots or notches 18 in the end 20 of the PCB 10' on the side where the PCB 10' is inserted into a housing 16'. Each notch 18 is electrically conductive so as to power the PCB once connected with an associated electrically conductive pin, generally indicated at 14'.

Figure 1:
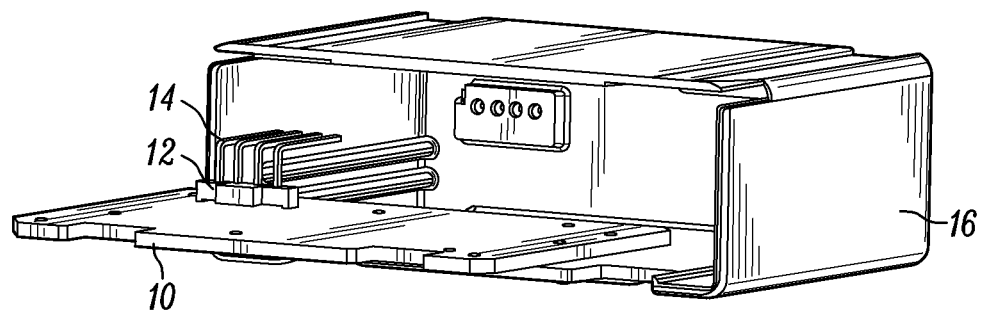
FIG. 1 is view of a conventional PCB having a plastic pin header and pins wave soldered to the PCB, with the PCB shown disposed in a housing.

A plurality of electrically conductive pins, generally indicated at 14', is mounted to the housing 16' in a molded or press fitted manner. Each pin 14' can be an individual pin that is then molded or press fitted into the housing 16' so as to align with an associated notch 18. This configuration eliminates the need for the pin header 12 of FIG. 1. Each pin 14' has a connecting portion 22, constructed and arranged to be connected with a mating electrical connector (not shown), and an engaging portion 24 preferably disposed generally 90° with respect to the connecting portion 22. When the PCB 10' is moved in the direction of arrow A in FIG. 2, each engaging portion 24 is received in and engages an associated notch 18 in the PCB 10 in a press-fitted manner, as shown in FIGS. 3 and 4. This press fit area of the pins 14' to the PCB 10' does not require significant force as long as electrical connection is made, since the housing 16' and cover (not shown) will hold the PCB 10' from moving. When the electrical connector (not shown) is inserted into the connector housing 26, the stress is no longer transferred to the PCB 10' because the pins 14' are held in by the housing 16'.

With the pins 14' molded or fitted into the housing 16' and engaged in a press-fitted manner with the PCB 10', space on the PCB 10' can be saved. Also, the plastic pin header of the prior art configuration can be eliminated along with the cost of tooling the pin header.

Figure 6:
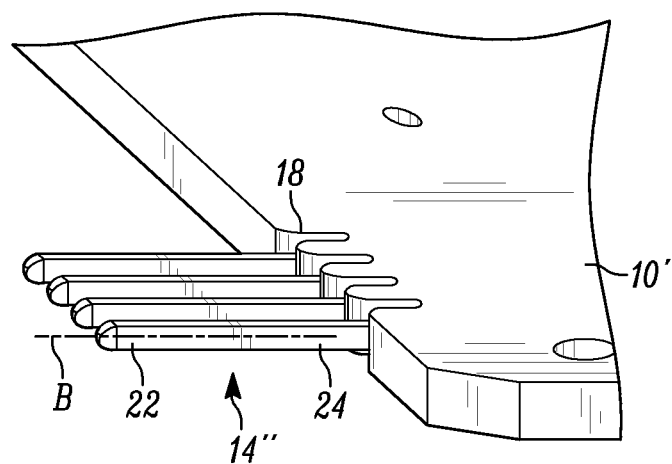
FIG. 6 is a view of an embodiment of straight pins press-fitted into notches of the PCB of FIG. 2.

Although the pins 14' are shown to be bent 90° degrees, with reference to FIG. 6, the pins 14" can be straight pins, with an end opposite the connecting portion 22 defining the engaging portion 24 of each pin 14". Thus, the connecting portion 22 and the engaging poring 24 are both on the same axis B. The straight pins 14" would require a less expensive stamping.

With reference to FIG. 5, instead of sliding the PCB 10' along the longitudinal axis C into the housing, the PCB 10' can be pressed down (in a direction transverse to the longitudinal axis C) into the housing 16' to engage the pins 14'. In another embodiment, instead of providing the pins 14' in the housing 16', the pins 14' can be considered to be part to the electrical connector (not shown) that is inserted into the connector housing 26, such that once inserted therein, the pins of the electrical connector engage the notches 18 in the manner discussed above.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A printed circuit board assembly comprising:
    a printed circuit board (PCB) having an end, the end including surfaces defining a plurality of electrically conductive notches therein, and
    a housing comprising a plurality of electrically conductive pins fixed in the housing, each pin including a connecting portion constructed and arranged to be connected with a mating electrical connector and an engaging portion constructed and arranged to be received in an associated notch of the plurality of notches in a press-fitted manner so as to make electrical connection with the PCB,
    the PCB and the housing further constructed and arranged to engage each pin with the associated notch of the plurality of notches in response one of sliding and pressing the PCB into the housing.

2. The assembly of claim 1, wherein the engaging portion is disposed generally 90° with respect to the connecting portion.

3. The assembly of claim 2, wherein each pin of the plurality of pins is press-fitted into the housing.

4. The assembly of claim 2, wherein each pin of the plurality of pins is molded into the housing.

5. The assembly of claim 1, wherein the connecting portion and the engaging portion are both on the same axis.

* * * * *